(12) United States Patent
Ayotte et al.

(10) Patent No.: US 7,745,256 B2
(45) Date of Patent: Jun. 29, 2010

(54) RECTANGULAR-SHAPED CONTROLLED COLLAPSE CHIP CONNECTION

(75) Inventors: Stephen P. Ayotte, Bristol, VT (US); David J. Hill, Richmond, VT (US); Timothy M. Sullivan, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/114,867

(22) Filed: May 5, 2008

(65) Prior Publication Data

US 2009/0273095 A1 Nov. 5, 2009

(51) Int. Cl.
*H01L 21/50* (2006.01)
(52) U.S. Cl. ............... 438/106; 438/612; 257/E21.111; 716/1
(58) Field of Classification Search .................. 257/678, 257/666, 778, E23.001, E21.211, 780, 781, 257/784; 438/106, 455, 108, 612; 716/1, 716/4, 14, 2; 703/14
See application file for complete search history.

(56) References Cited

U.S. PATENT DOCUMENTS

| 6,238,948 | B1 | 5/2001 | Ramalingam |
| 6,635,960 | B2 | 10/2003 | Farrar |
| 2008/0181558 | A1* | 7/2008 | Hartwell et al. ............... 385/14 |

* cited by examiner

*Primary Examiner*—Hoa B Trinh
(74) *Attorney, Agent, or Firm*—David Cain; Hoffman Warnick LLC (57) ABSTRACT

A rectangular-shaped controlled collapse chip connection (C4) is described. In one embodiment, there is a semiconductor chip package that comprises a semiconductor chip package substrate and a semiconductor chip having a plurality of rectangular-shaped C4 contacts attached thereto that connect the semiconductor chip to the semiconductor chip package substrate. The plurality of rectangular-shaped C4 contacts are arranged along a surface of the semiconductor chip in an orientation that extends radially from a center of the surface of the semiconductor chip.

5 Claims, 6 Drawing Sheets

RECTANGULAR-SHAPED CONTROLLED COLLAPSE CHIP CONNECTION

BACKGROUND

This disclosure relates generally to a semiconductor chip package, and more specifically to a rectangular-shaped controlled collapse chip connection (C4) used to connect a semiconductor chip package substrate and a semiconductor chip.

A semiconductor chip also commonly referred to as an integrated circuit or a die is typically assembled into a semiconductor chip package that is soldered to a printed circuit board. One type of semiconductor chip package is a flip chip, also known as a C4 package. The semiconductor chip package typically includes the semiconductor chip which contains a number of round solder bumps that are attached to a top surface of the chip. The semiconductor chip via the solder bumps is soldered to pads located along a top surface of a semiconductor chip package substrate forming a metallurgical joint between the chip and the substrate. The substrate is typically constructed from a composite material which has a coefficient of thermal expansion (CTE) that is different than the CTE for the semiconductor chip. In particular, the CTE of the semiconductor chip is relatively low (e.g., 2-3 parts per million) compared to the CTE of the substrate (e.g., 17-20 parts per million). As a result, the semiconductor chip expands relatively slow in comparison to the substrate, which expands relatively fast. Any variation in the temperature of the package may cause a resultant differential expansion between the semiconductor chip and the substrate. As a result, the surfaces of the semiconductor chip and the substrate lose proximity with respect to each other. Consequently, the differential expansion may induce stresses that can crack the round solder bumps. The solder bumps carry electrical current between the semiconductor chip and the substrate, so any crack in the bumps may affect the operation of the chip.

SUMMARY

Therefore, it is desirable to develop an approach for improving the ability to form a metallurgical joint by compensating for the differential expansion of the chip with respect to the substrate.

In one embodiment, there is a semiconductor chip package that comprises a semiconductor chip package substrate and a semiconductor chip having a plurality of rectangular-shaped controlled collapse chip connection (C4) contacts attached thereto that connect the semiconductor chip to the semiconductor chip package substrate. The plurality of rectangular-shaped C4 contacts are arranged along a surface of the semiconductor chip in an orientation that extends radially from a center of the surface of the semiconductor chip.

In a second embodiment, there is a method of forming a semiconductor chip package. In this embodiment, the method comprises: providing a semiconductor chip; attaching a plurality of rectangular-shaped controlled collapse chip connection (C4) contacts to the semiconductor chip, wherein the plurality of rectangular-shaped C4 contacts are arranged along a surface of the semiconductor chip in an orientation that extends radially from a center of the surface of the semiconductor chip; and coupling the semiconductor chip to a semiconductor chip package substrate via the plurality of rectangular-shaped C4 contacts.

In a third embodiment, there is computer-readable medium storing computer instructions, which when executed, enables a computer system to determine an arrangement of interconnects that connect a semiconductor chip to a semiconductor chip package substrate. The computer instructions comprises: obtaining a plurality of rectangular-shaped controlled collapse chip connection (C4) contacts; and determining an arrangement of the plurality of rectangular-shaped C4 contacts along a surface of the semiconductor chip, wherein the arrangement includes locating the plurality of rectangular-shaped C4 contacts along the surface of the semiconductor chip in an orientation that extends radially from a center of the surface of the semiconductor chip.

DETAILED DESCRIPTION

Figure 1:
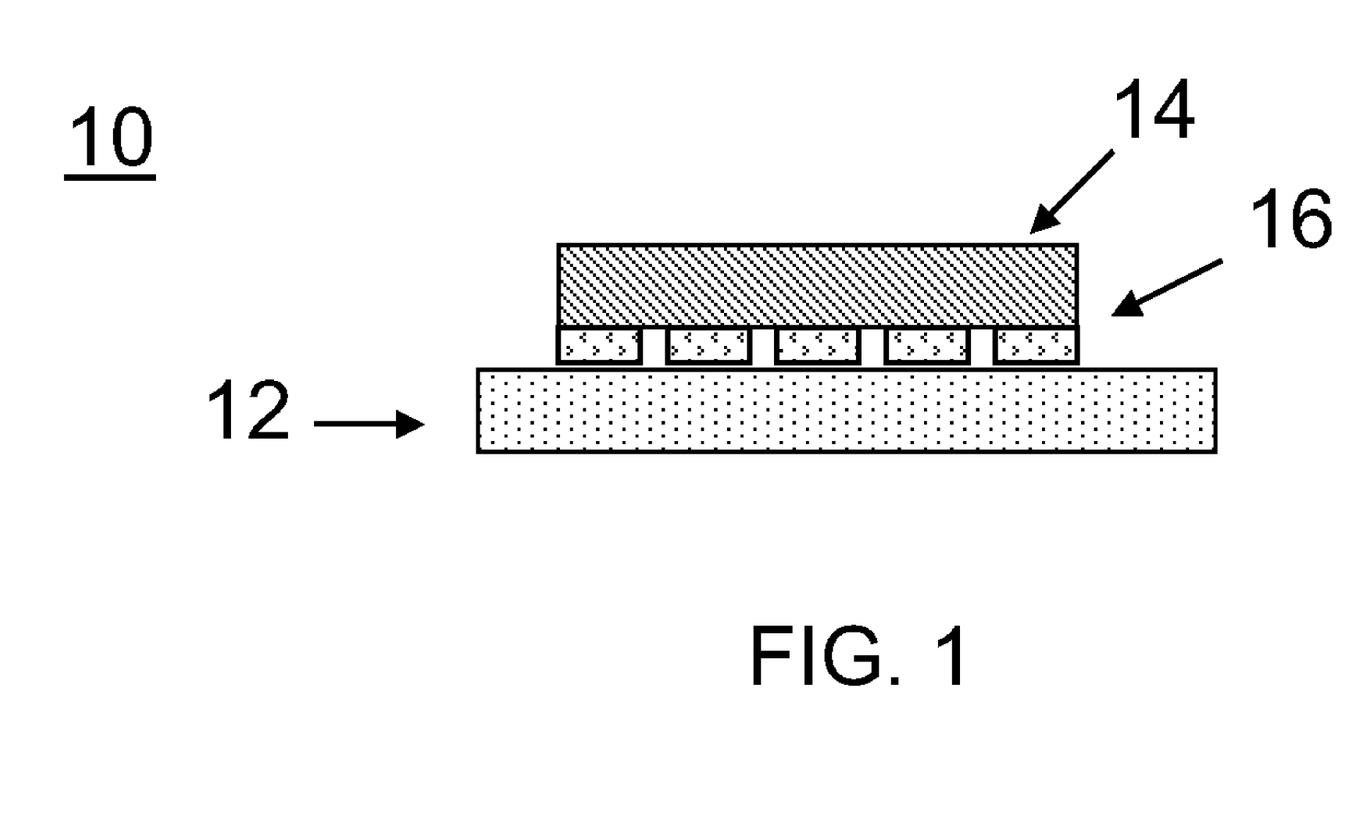
FIG. 1 shows a cross-sectional view of a semiconductor chip package according to one embodiment of the disclosure.

FIG. 1 shows a cross-sectional view of a semiconductor chip package 10 according to one embodiment of the disclosure. The semiconductor chip package 10 includes a semiconductor chip package substrate 12 and a semiconductor chip 14 having a plurality of rectangular-shaped controlled collapse chip connection (C4) contacts 16 attached to a surface of the chip that connect to respective pads (not shown) disposed on a surface of the semiconductor chip package substrate 12 to form a metallurgical joint. The plurality of rectangular-shaped C4 contacts 16 are any solderable material that can include but is not limited to material having tin and lead, tin without lead, tin with a residual of copper or silver, tin bismuth, tin indium, etc.

For ease of illustration, FIG. 1 only shows the elements of the semiconductor chip package 10 necessary to describe the embodiments of the present disclosure. Those skilled in the art will recognize that the semiconductor chip package 10 may have additional elements than what is illustrated in FIG. 1. For example, the semiconductor chip package may have an underfill material between the substrate 12 and the chip 14, an organic layer also known as polyimide on the surface of the substrate between the substrate 12 and the chip 14.

As mentioned above, a conventional semiconductor chip package utilizes a number of round solder bumps attached to a top surface of the semiconductor chip that are soldered to the pads located along a top surface of the semiconductor chip package substrate. Because the substrate is typically constructed from a composite material which has a coefficient of thermal expansion (CTE) that is different than the CTE for the semiconductor chip, any variation in the temperature of the package will cause a resultant differential expansion between the semiconductor chip and the substrate that results in a loss of proximity with respect to each other. Consequently, the differential expansion results in the lack of formation of a metallurgical joint that affects the operation of the chip.

By using rectangular-shaped C4 contacts 16 instead of the conventional round solder bumps, the semiconductor chip package 10 of the present disclosure is able to minimize the problems associated with mismatches in the CTEs of the semiconductor chip and the substrate. In particular, it has been determined that a rectangular-shaped C4 contact results in a crown (i.e., the top portion of the C4 contact) that is proportionally related to the size of the rectangle, and that will provide maximum bonding surface area. A larger bonding surface area allows for more time and area for the solder of the rectangular-shaped C4 contacts 16 to make contact with the pads on the substrate 12, and allow for the formation of a metallurgical joint between the semiconductor chip 14 and the substrate 12.

Figure 2:
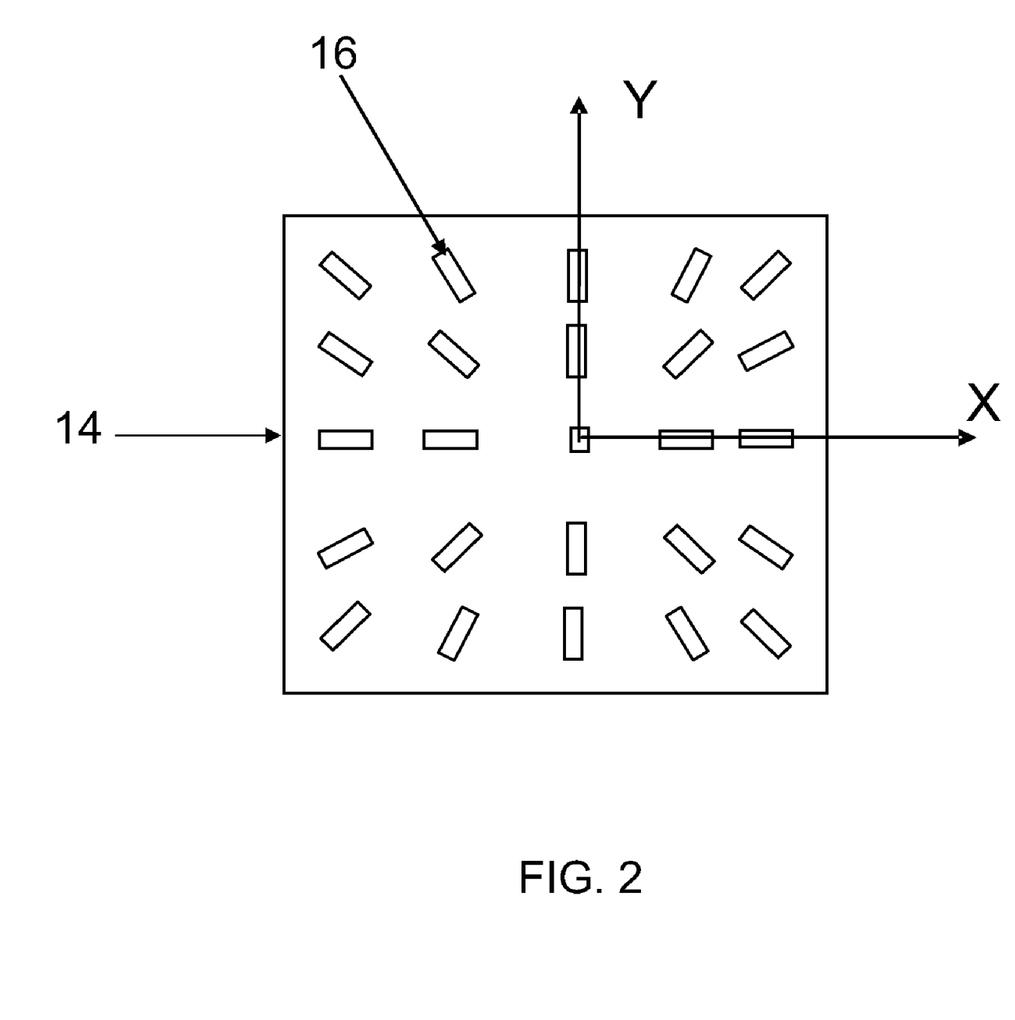
FIG. 2 shows a top view illustrating an arrangement of a plurality of rectangular-shaped controlled collapse chip connection (C4) contacts disposed on a semiconductor chip depicted in the semiconductor chip package of FIG. 1 according to one embodiment of the invention.

FIG. 2 shows a top view illustrating an arrangement of the plurality of rectangular-shaped C4 contacts 16 on of the semiconductor chip 14 depicted in FIG. 1 according to one embodiment of the disclosure. In the embodiment shown in FIG. 2, the plurality of rectangular-shaped C4 contacts 16 are arranged in an orientation that extends radially from a center of the surface of the semiconductor chip 12 in an X-Y grid. Arranging the plurality of rectangular-shaped C4 contacts 16 in an orientation that extends radially from a center provides a runway for the solderable material associated with the C4 to spread out farther to give a much larger surface bonding area that enables formation of a metallurgical joint. Essentially, the arrangement of the rectangular-shaped C4 contacts is providing compensation for the CTEs of the substrate 12 and semiconductor chip 14 material in the X-Y locations.

The position of the center point along the surface of the semiconductor chip 14 from which the rectangular-shaped C4 contacts 16 extend radially from is described as:

$$r \geq r(1+\Delta CTE(T-25° C.)), \text{wherein} \tag{1}$$

r is the absolute design location of the center point;

$\Delta CTE = CTE_{substrate} - CTE_{chip}$, wherein $CTE_{substrate}$ is the CTE of the semiconductor chip package substrate and $CTE_{chip}$ is the CTE of the semiconductor chip; and T is the temperature in Celsius in which the semiconductor chip package substrate is assembled with the semiconductor chip.

From this center point, the other locations of the rectangular-shaped C4 contacts that extend radially therefrom towards the edges of the surface of the semiconductor chip can be determined. These locations are determined as a function of a material characteristic associated with the substrate 12 and the semiconductor chip 14. In one embodiment, the material characteristic is the CTE. In this embodiment, the other locations of the rectangular-shaped C4 contacts are determined by using formula 1. In particular, formula 1 takes the design location of the C4 contact as described by r, using the material characteristic CTE to determine a ΔCTE and the temperature of joining, T (which is known) to derive a location for placement of the C4 contact.

Figure 3:
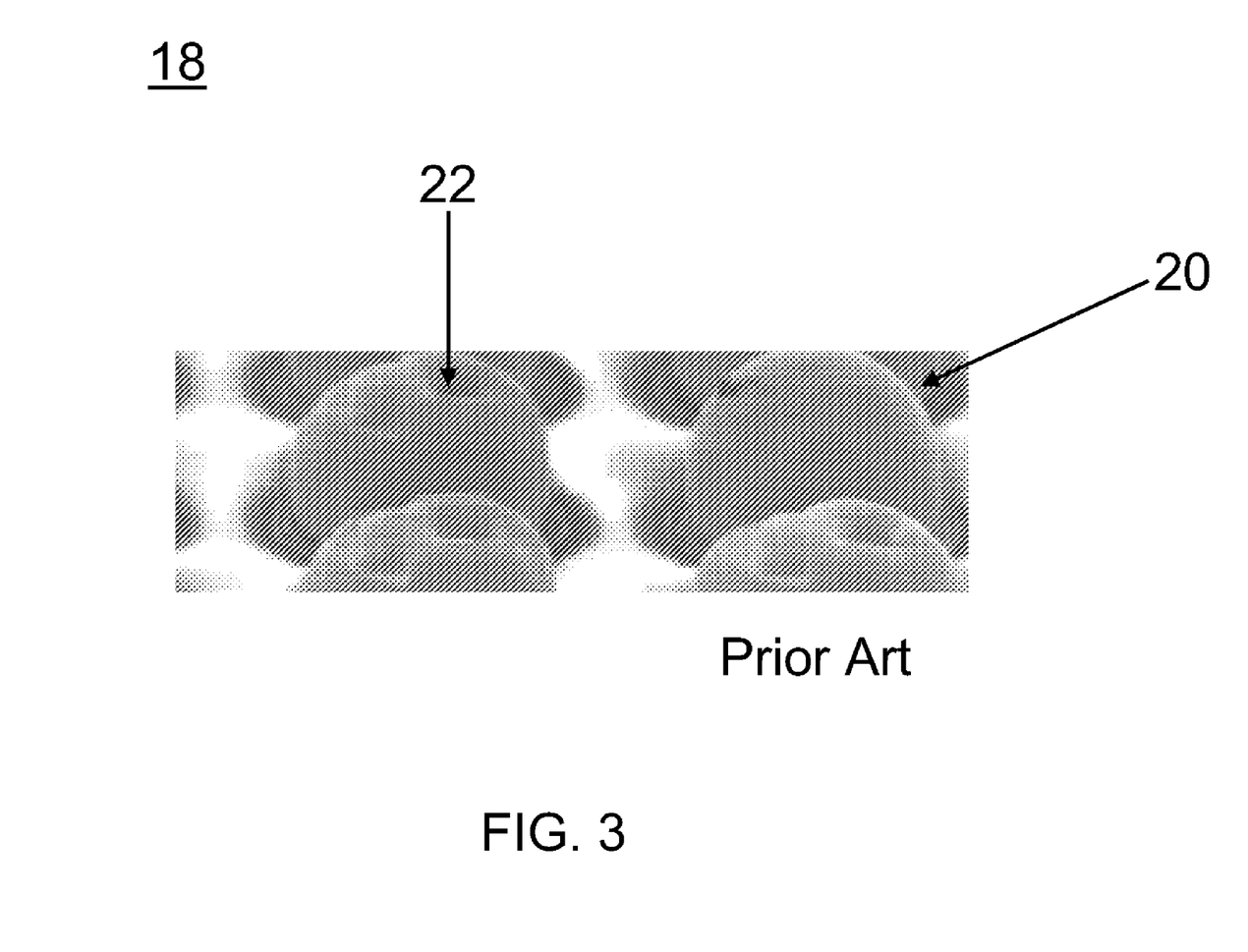
FIG. 3 shows a photograph of conventional solder balls used in a semiconductor chip package that have experienced deformation from a tester.

There are further advantages to using the rectangular-shaped C4s in addition to minimizing problems associated with mismatches in the CTEs of the semiconductor chip and the substrate. For example, the rectangular-shape of the C4 provides for a portion of the mound of the solder material that forms at the crown that is reserved for the location of a wafer final test probe to land on when undergoing a test to determine whether all desired functionality of the semiconductor chip 14 is within specification. Typically, when a conventional round solder ball is probed during the testing phase, deformation of the solder ball occurs. FIG. 3 shows a photograph 18 of conventional solder balls 20 used in a semiconductor chip package that have experienced deformation from a tester probe. Deformation of the solder balls 20 is shown in FIG. 3 as an indentation 22 in the ball. To reshape the solder balls 20, a reflow operation is performed which entails passing the solder balls through a furnace-like device that is hot enough to reshape the solder balls to their non-deformed state. Performing a reflow operation is costly and inefficient and furthermore some new materials used in semiconductor designs have a limit on how many times a reflow can be performed. With these materials, if the limit on reflows is reached, then the product has to be scrapped.

Figure 4:
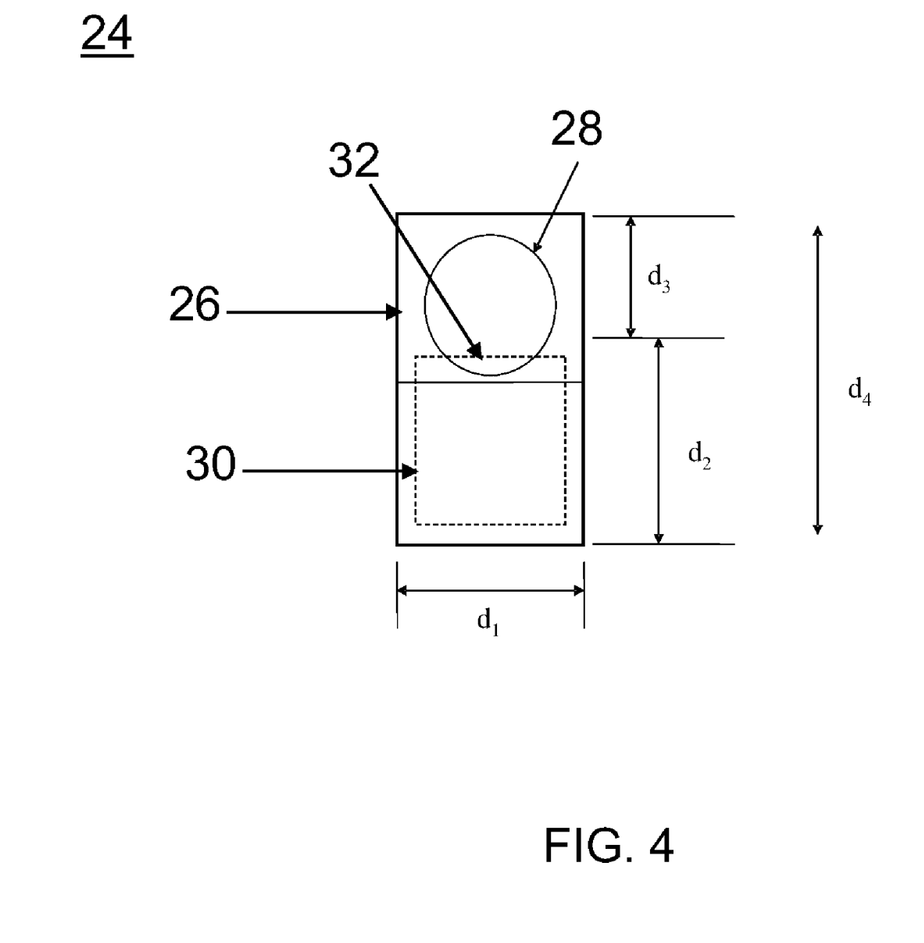
FIG. 4 shows a schematic of the surface bonding area associated with using the rectangular-shaped C4 contacts in a semiconductor chip package.

Embodiments of the present disclosure have overcome the need for the reflow operations by providing for a portion of the mound of the solder material of the rectangular-shaped that is reserved for the location of the wafer final test probe to land on. This compensates for any deformation that would occur from probing and thereby eliminates the need to do reflow and cause the reduction in field reliability. FIG. 4 shows a schematic 24 illustrating the surface bonding area associated with using the rectangular-shaped C4 contact 16 in a semiconductor chip package 10. In FIG. 4, reference element 26 represents the area of the rectangular-shaped C4 contact 16. Reference element 28 represents a wire bond area which is another method of interconnecting a semiconductor chip to a substrate. Reference element 30 represents the probe area that will be probed during the testing phase of the of the semiconductor package 10. Reference element 32, which covers the intersection of the wire bond area 28 with the probe area 30, represents the height of the mound of the rectangular-shaped C4 that will compensate for any deformation that could arise during probing. The dimensions of the surface bonding area 26 associated with using the rectangular-shaped C4 contact 16, the wire bond area 28, the probe area 30 are illustrated in FIG. 4 as $d_4 \times d_1$, $d_3$ and $d_2$, respectively. In one embodiment, for a pad size of 42 μm×80 μm, $d_2$ is 50 μm and $d_3$ is 30 μm.

Figure 5:
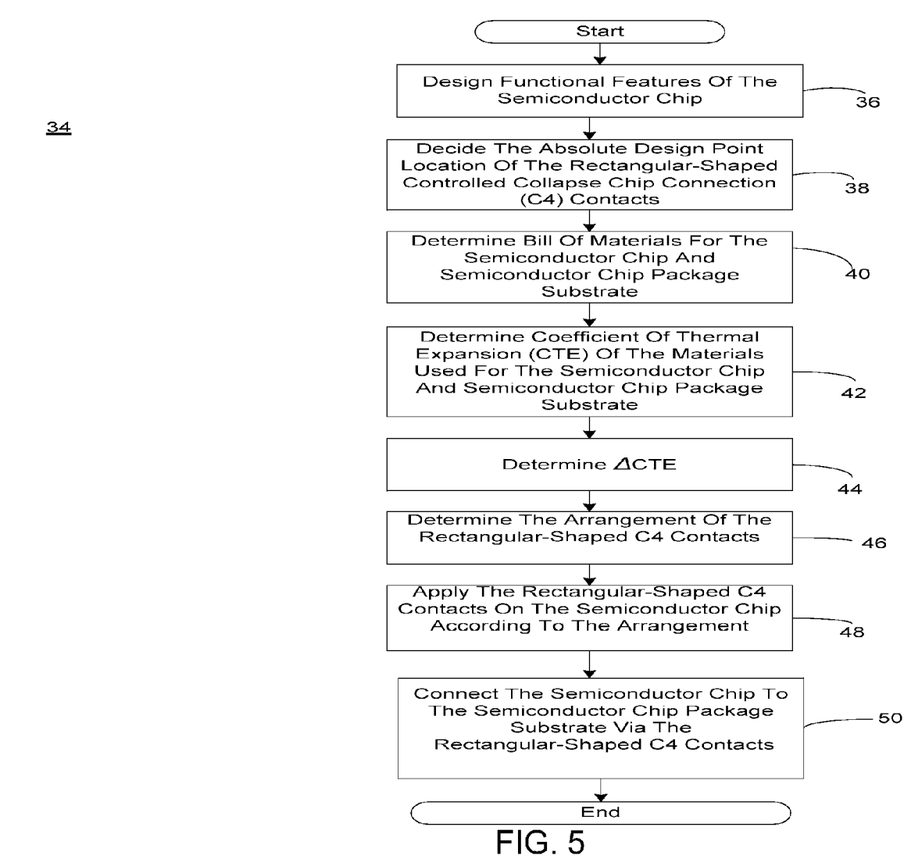
FIG. 5 shows a flow diagram describing a design process of assembling a semiconductor chip package that uses a plurality of rectangular-shaped C4 contacts that attach a semiconductor chip to a semiconductor chip package substrate according to one embodiment of this disclosure.

FIG. 5 shows a flow diagram 34 describing a design process of assembling a semiconductor chip package that uses a plurality of rectangular-shaped C4 contacts that attach a semiconductor chip to a semiconductor chip package substrate according to one embodiment of this disclosure. The design process 34 as shown in FIG. 5 starts at 36 where a semiconductor designer designs all of the functional features of the semiconductor chip. The semiconductor designer then decides the absolute design point location of the rectangular-shaped C4s contacts at 38. The semiconductor designer and an application engineer determine at 40 what materials of construction also referred to as bill of materials should be used for the semiconductor chip and the semiconductor chip package substrate. By knowing the bill of materials then it can be determined at 42 what the CTEs are for the semiconductor chip and the semiconductor chip package substrate. At 44, the ΔCTE is determined and then the arrangement of the rectangular-shaped contacts can be determined at 46 using formula 1. With the arrangement, the rectangular-shaped C4 contacts can be applied to the semiconductor chip at 48 and then the chip can be connected to the semiconductor chip package substrate via the C4 contacts to form the semiconductor chip package.

The foregoing flow chart of FIG. 5 show some of the processing acts associated with assembling a semiconductor chip package that uses a plurality of rectangular-shaped C4 contacts. In this regard, each block in the flow chart represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe these processing acts may be added.

In one embodiment, formula 1 can be implemented in a design tool that enables a semiconductor manufacturer to predict the arrangement of the C4 contacts for their developed semiconductor chip packages. In this embodiment, the formula is implemented in software, which includes but is not limited to, firmware, resident software, microcode, etc., and is used and processed by a computer system to design the arrangement of the plurality of rectangular-shaped C4s for the semiconductor chip package 10. The software used to design the arrangement of the plurality of rectangular-shaped C4s can take the form of a computer program product accessible from a computer-usable or computer-readable medium providing program code for use by or in connection with the computer system. For the purposes of this description, a computer-usable or computer readable medium can be any apparatus that can contain, store, communicate, propagate, or transport the program for use by or in connection with the computer system. The medium can be any apparatus that can contain, store, communicate, propagate, or transport the program containing the instructions for performing the processing functions for use by or in connection with the computer system. The computer readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include a compact disk-read only memory (CD-ROM), a compact disk-read/write (CD-R/W) and a digital video disc (DVD).

Figure 6:
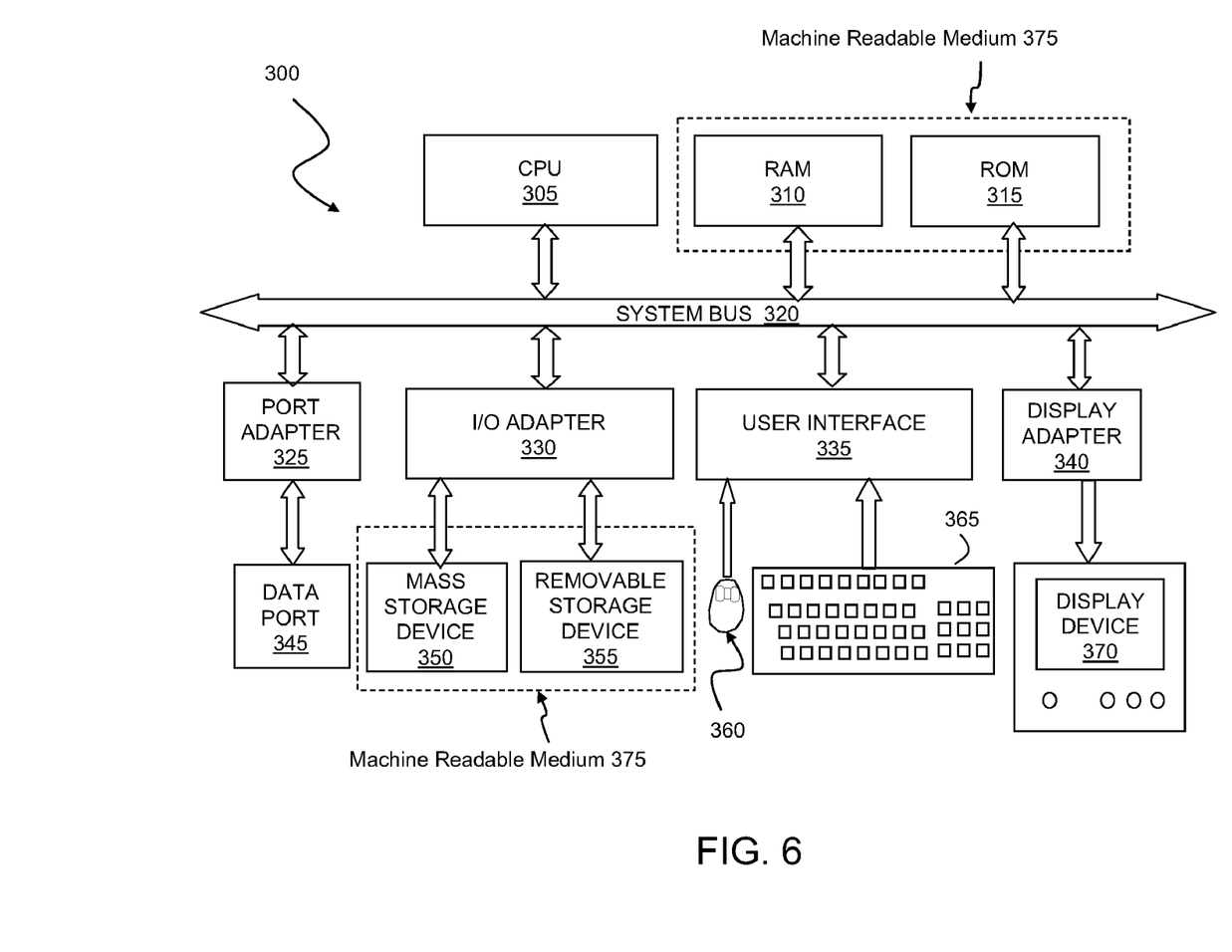
FIG. 6 shows a block diagram of a general-purpose computer system which can be used to arrange a plurality of rectangular-shaped C4 contacts in a design of a semiconductor chip package.

FIG. 6 shows a block diagram of a general-purpose computer system which can be used to arrange a plurality of rectangular-shaped C4 contacts in a design of a semiconductor chip package. FIG. 6 shows a computer system 300, which has at least one microprocessor or central processing unit (CPU) 305. CPU 305 is interconnected via a system bus 320 to machine readable media 375, which includes, for example, a random access memory (RAM) 310, a read-only memory (ROM) 315, a removable and/or program storage device 355 and a mass data and/or program storage device 350. An input/output (I/O) adapter 330 connects mass storage device 350 and removable storage device 355 to system bus 320. A user interface 335 connects a keyboard 365 and a mouse 360 to system bus 320, and a port adapter 325 connects a data port 345 to system bus 320 and a display adapter 340 connects a display device 370. ROM 315 contains the basic operating system for computer system 300. Examples of removable data and/or program storage device 355 include magnetic media such as floppy drives, tape drives, portable flash drives, zip drives, and optical media such as CD ROM or DVD drives. Examples of mass data and/or program storage device 350 include hard disk drives and non-volatile memory such as flash memory. In addition to keyboard 365 and mouse 360, other user input devices such as trackballs, writing tablets, pressure pads, microphones, light pens and position-sensing screen displays may be connected to user interface 335. Examples of display device 370 include cathode-ray tubes (CRT) and liquid crystal displays (LCD).

A machine readable computer program may be created by one of skill in the art and stored in computer system 300 or a data and/or any one or more of machine readable medium 375 to simplify the practicing of this disclosure. In operation, information for the computer program created to run the present disclosure is loaded on the appropriate removable data and/or program storage device 355, fed through data port 345 or entered using keyboard 365. A user controls the program by manipulating functions performed by the computer program and providing other data inputs via any of the above mentioned data input means. Display device 370 provides a means for the user to accurately control the computer program and perform the desired tasks described herein.

The semiconductor chip package as described above for FIG. 1 may be part of a design that is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer.

The resulting semiconductor chip package described in embodiments of this disclosure can be mounted as a single chip package with leads that are affixed to a motherboard or other higher level carriers or in a multichip package such as a ceramic carrier that has either or both surface interconnections or buried interconnections. In any case the semiconductor chip package is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is apparent that there has been provided by this disclosure an approach for providing rectangular-shaped controlled collapse chip connection. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A computer-readable medium storing computer instructions, which when executed, enables a computer system to determine an arrangement of interconnects that connect a semiconductor chip to a semiconductor chip package substrate, the computer instructions comprising:

obtaining a plurality of rectangular-shaped controlled collapse chip connection (C4) contacts; and determining an arrangement of the plurality of rectangular-shaped C4 contacts along a surface of the semiconductor chip, wherein the arrangement includes locating the plurality of rectangular-shaped C4 contacts along the surface of the semiconductor chip in an orientation that extends radially from a center of the surface of the semiconductor chip wherein the determining of the arrangement of the plurality of rectangular-shaped C4 contacts comprises instructions for determining a center point that the plurality of rectangular-shaped C4 contacts extend radially therefrom, wherein the center point has a position along the surface of the semiconductor chip described as:

$r > r(1 + \char`\^CTE(T-25°C.))$, wherein r is the absolute design location of the center point;
^CTE=CTEsubstrate- CTEchip, wherein CTEsubstrate is the CTE of the semiconductor chip package substrate and CTEchip is the CTE of the semiconductor chip; and
T is the temperature in Celsius in which the semiconductor chip package substrate is assembled with the semiconductor chip.

2. The computer-readable medium according to claim 1, wherein the determining of the arrangement of the plurality of rectangular-shaped C4 contacts comprises instructions for ascertaining a material characteristic associated with the semiconductor chip package substrate and semiconductor chip and using the material characteristic to determine the arrangement of the plurality of the rectangular-shaped C4 contacts.

3. The computer-readable medium according to claim 2, wherein the material characteristic associated with the semiconductor chip package substrate and semiconductor chip is a coefficient of thermal expansion (CTE).

4. The computer-readable medium according to claim 1, further comprising instructions for determining locations to arrange the plurality of rectangular-shaped C4 contacts that extend radially from the location of the center point towards the edges of the surface of the semiconductor chip, wherein the locations are a function of a material characteristic associated with the semiconductor chip package substrate and semiconductor chip.

5. The computer-readable medium according to claim 1, further comprising instructions for providing the plurality of rectangular-shaped C4 contacts with a maximum surface bonding area with the semiconductor chip package substrate.

* * * * *